United States Patent
Sun et al.

(10) Patent No.: US 8,264,255 B2
(45) Date of Patent: Sep. 11, 2012

(54) RADIO FREQUENCY (RF) POWER DETECTOR SUITABLE FOR USE IN AUTOMATIC GAIN CONTROL (AGC)

(75) Inventors: Ruifeng Sun, Austin, TX (US); Yunteng Huang, Palo Alto, CA (US)

(73) Assignee: Silicon Laboratories Inc., Austin, TX (US)

( * ) Notice: Subject to any disclaimer, the term of this patent is extended or adjusted under 35 U.S.C. 154(b) by 367 days.

(21) Appl. No.: 12/611,151

(22) Filed: Nov. 3, 2009

(65) Prior Publication Data

US 2011/0102047 A1     May 5, 2011

(51) Int. Cl.
 *H03K 5/153* (2006.01)
(52) U.S. Cl. ............... 327/58; 327/74; 327/76
(58) Field of Classification Search .............. 327/58, 327/74, 76
See application file for complete search history.

(56) References Cited

U.S. PATENT DOCUMENTS

| | | | |
|---|---|---|---|
| 6,798,286 B2 * | 9/2004 | Dauphinee et al. | 330/129 |
| 7,504,813 B2 * | 3/2009 | Manstretta | 323/312 |
| 7,579,912 B2 * | 8/2009 | Fanous et al. | 330/254 |
| 7,676,200 B2 * | 3/2010 | Carmon et al. | 455/91 |
| 7,738,845 B2 * | 6/2010 | Takahashi et al. | 455/126 |
| 7,773,955 B2 * | 8/2010 | Behzad | 455/77 |
| 7,786,720 B2 * | 8/2010 | Arnborg | 324/120 |
| 7,990,220 B2 * | 8/2011 | Kondo et al. | 330/276 |
| 2006/0222115 A1 | 10/2006 | Dornbusch et al. | |

OTHER PUBLICATIONS

J.M. Stevenson et al., "A Multi-Standard Analog and Digital TV Tuner for Cable and Terrestrial Applications", IEEE ISSCC Dig. Tech. Papers, Feb. 2007, pp. 210-211, 597.

* cited by examiner

*Primary Examiner* — Kenneth B. Wells
(74) *Attorney, Agent, or Firm* — Polansky & Associates, P.L.L.C.; Paul J. Polansky

(57) ABSTRACT

In one form, a power detector includes first and third transistors of a first conductivity type, and second and fourth transistors of a second conductivity type. A control electrode of the first transistor receives a first bias voltage plus a positive component of a differential input signal. The second transistor is coupled in series with the first transistor and has a control electrode receiving a second bias voltage plus a negative component of the differential input signal. The third transistor is biased using the first bias voltage plus the negative component. The fourth transistor is coupled in series with the third transistor and is biased using the second bias voltage plus the positive component. A common interconnection point of the first and third transistors forms an output node. In another form, a power detector compares an output of a power detector core to multiple threshold voltages in corresponding comparators.

9 Claims, 6 Drawing Sheets

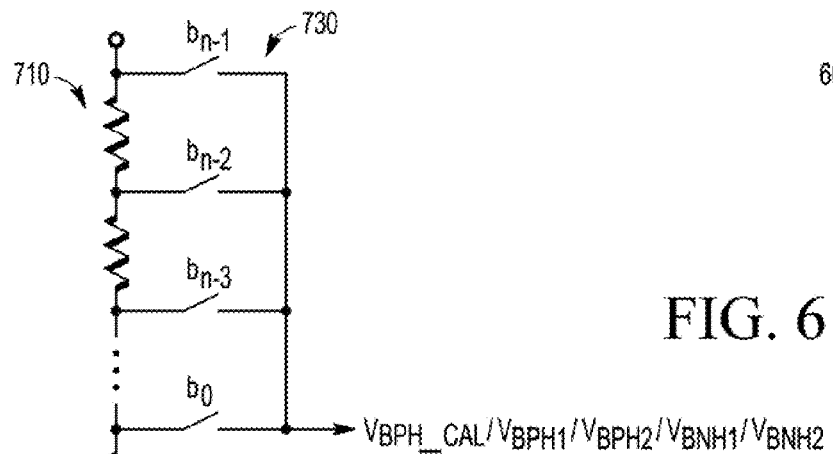
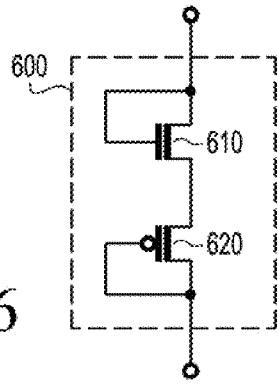
FIG. 6
FIG. 7
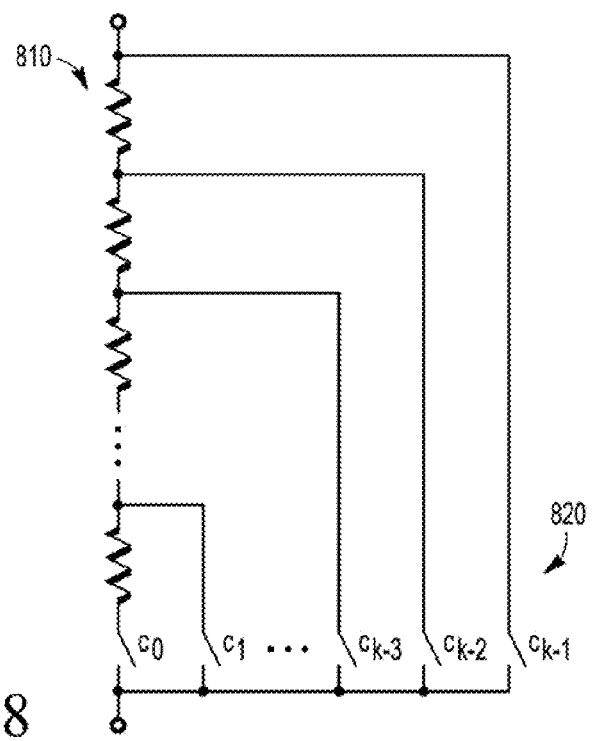
FIG. 8

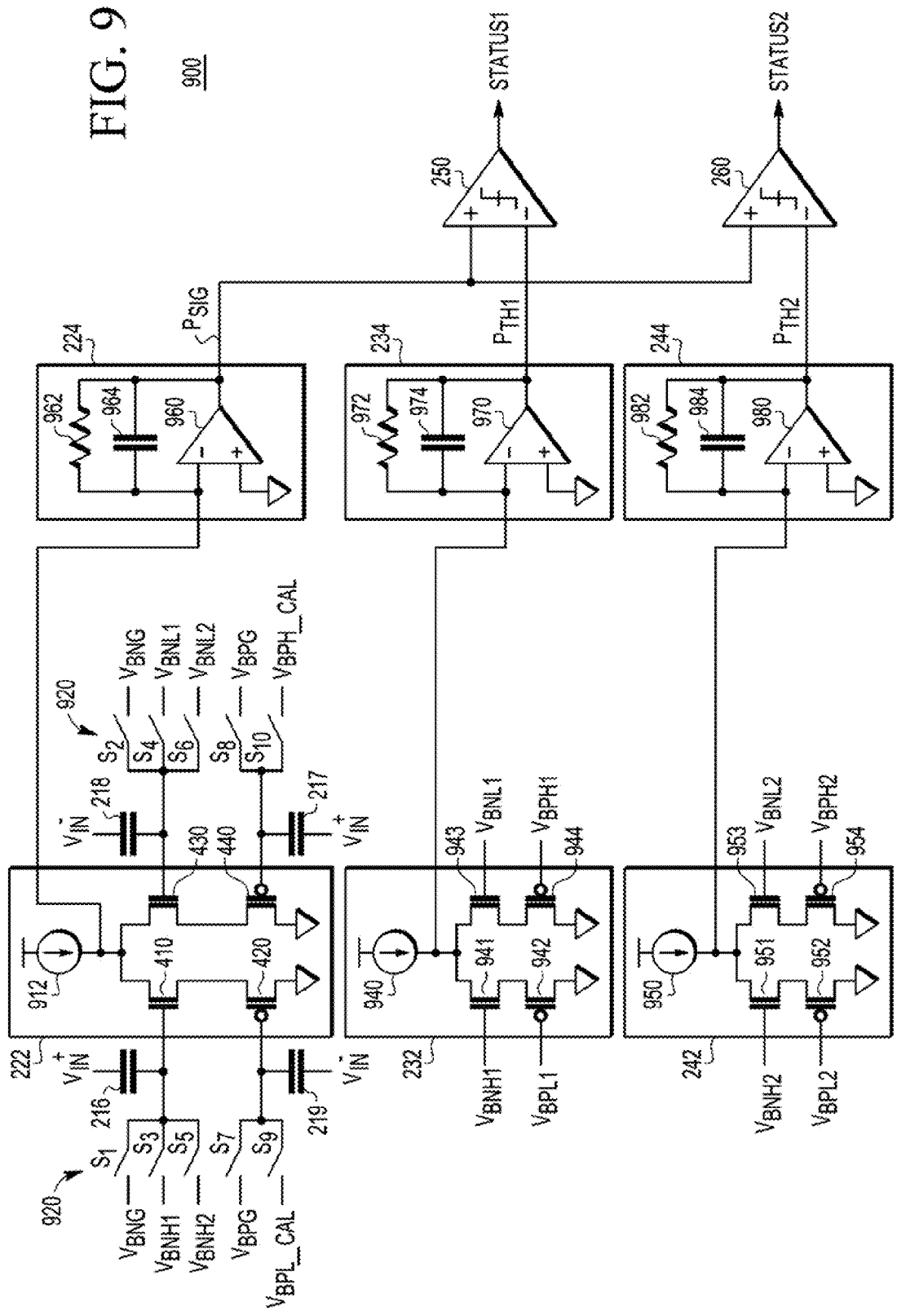

RADIO FREQUENCY (RF) POWER DETECTOR SUITABLE FOR USE IN AUTOMATIC GAIN CONTROL (AGC)

FIELD OF THE DISCLOSURE

The present disclosure relates generally to power detectors, and more particularly to power detectors suitable for use in automatic gain control (AGC) circuits of radio frequency (RF) receivers.

BACKGROUND

A radio frequency (RF) signal includes useful information that is modulated onto a carrier signal. An RF receiver retrieves the useful information from the RF signal. RF receivers are used in a wide variety of applications such as television transmission, cellular telephones, pagers, global positioning systems (GPS), cable modems, cordless phones, satellite radios, and the like. As used herein, an RF signal means an electromagnetic signal having a frequency in a spectrum from about 3 kilohertz (kHz) to hundreds of gigahertz (GHz), regardless of the medium through which such signal is conveyed. Thus an RF signal may be transmitted through air, free space, coaxial cable, fiber optic cable, etc.

In many broadcast RF transmission systems, the frequency spectrum is relatively wide and is divided into separate channels that include different information. A television receiver receives the wide spectrum RF signal, mixes a desired channel to a convenient intermediate frequency (IF) to make it easier to filter, and then converts it to baseband where the information may be processed further. For example, a television receiver may translate a channel in the frequency spectrum of 48 megahertz (MHz) to 870 MHz to an intermediate frequency of 44 MHz.

Often, the RF signal power level in a particular channel is low, and needs to be amplified before being mixed or otherwise processed in the receiver. Thus receivers such as television receivers commonly use a technique known as automatic gain control (AGC). AGC systems use a feedback control loop to adjust the gain of an amplifier based on the input signal power level, so the output signal power level is relatively constant. In order to make a proper gain adjustment, the AGC loop needs a power detector capable of accurately measuring the signal power.

BRIEF DESCRIPTION OF THE DRAWINGS

The present disclosure may be better understood, and its numerous features and advantages made apparent to those skilled in the art by referencing the accompanying drawings, in which:

FIG. 6 illustrates in schematic form the dummy circuit used in the threshold level generator of FIG. 5;

FIG. 7 illustrates in schematic form the programmable resistor used in the threshold level generator of FIG. 5;

FIG. 8 illustrates in schematic form the offset digital-to-analog converter (DAC) used in the threshold level generator of FIG. 5; and FIG. 9 illustrates in partial block diagram and partial schematic form a particular embodiment of a portion of the power detector of FIG. 2.

The use of the same reference symbols in different drawings indicates similar or identical items.

DETAILED DESCRIPTION

Figure 1:
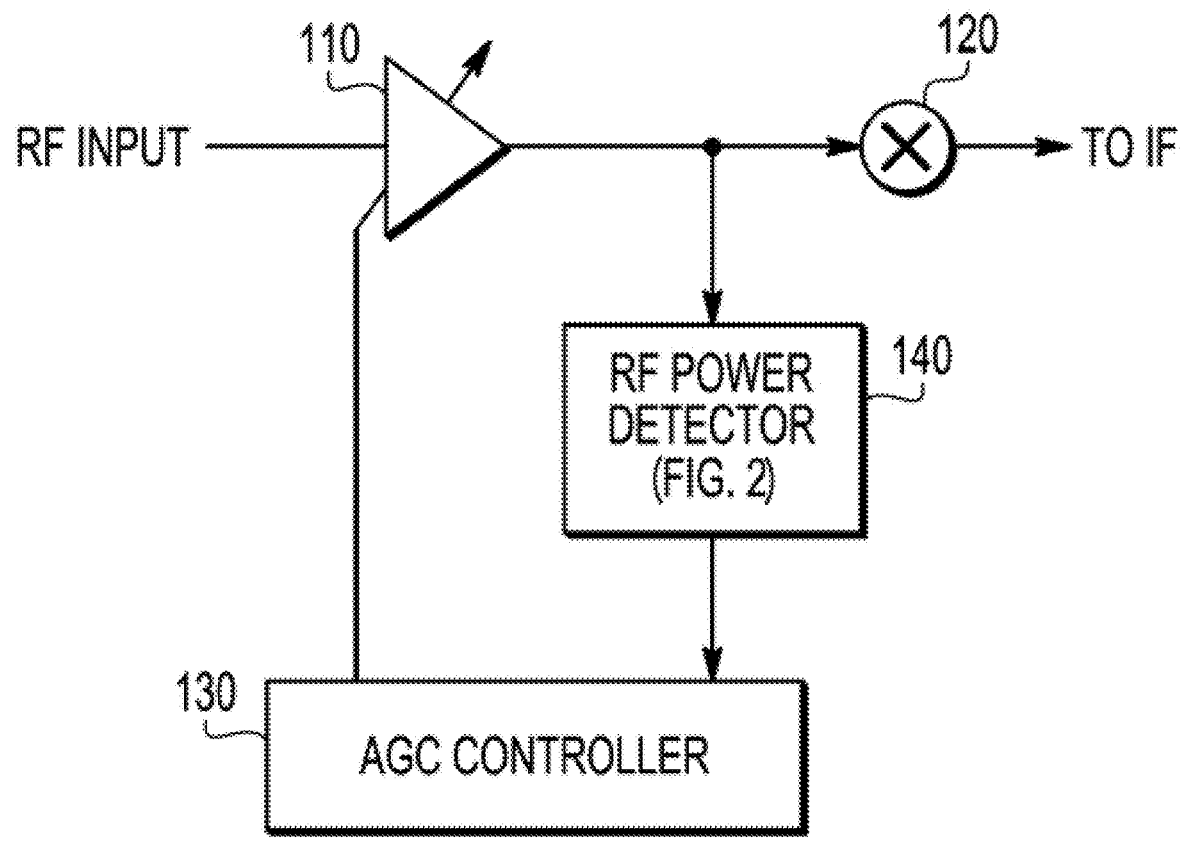
FIG. 1 illustrates in partial block diagram and partial schematic form a portion of a receiver having a radio frequency (RF) power detector according to the present invention.

FIG. 1 illustrates in partial block diagram and partial schematic form a portion of a receiver 100 having a radio frequency (RF) power detector according to the present invention. Receiver 100 includes generally a low noise amplifier (LNA) 110, a mixer 120, an automatic gain control (AGC) controller 130, and a power detector 140. LNA 110 has a signal input for receiving a radio frequency (RF) input signal labeled "RF INPUT", a control input, and an output. Mixer 120 has a first input connected to the output of LNA 110, a second input for receiving a local oscillator signal (not shown in FIG. 1), and an output for providing an intermediate frequency (IF) signal to further circuitry, not shown in FIG. 1. AGC controller 130 has an input, and an output connected to the control input of LNA 110. RF power detector 140 has an input connected to the output of LNA 110, and an output connected to the input of AGC circuit 130.

In general, RF power detector 140 assists AGC by determining the power in RF INPUT. AGC controller 130 is a microcontroller running under the control of firmware that adjusts the gain of LNA 110 based on inputs received from RF power detector 140. The precise algorithms that AGC controller 130 uses is not important to understanding the concepts discussed herein and they will not be described further.

Receiver 100 is designed for use in a television receiver, and therefore it receives input signal RF INPUT with channel information over a wide frequency range, such as 48-870 MHz for North American broadcast television. Receiver 100 supports both terrestrial and cable television applications, and the input signal strengths vary significantly between the two. In addition, receiver 100 is implemented using modern complementary metal oxide semiconductor (CMOS) transistors. As is well known, circuits built with CMOS transistors are subject to offset voltages due to mismatches in sizes and electrical characteristics. These offsets can affect sensed signals and in particular RF power detectors. However RF power detector 140 has a robust design that is less susceptible to these offset voltages as will be explained in detail with respect to FIGS. 2-9 below.

Figure 2:
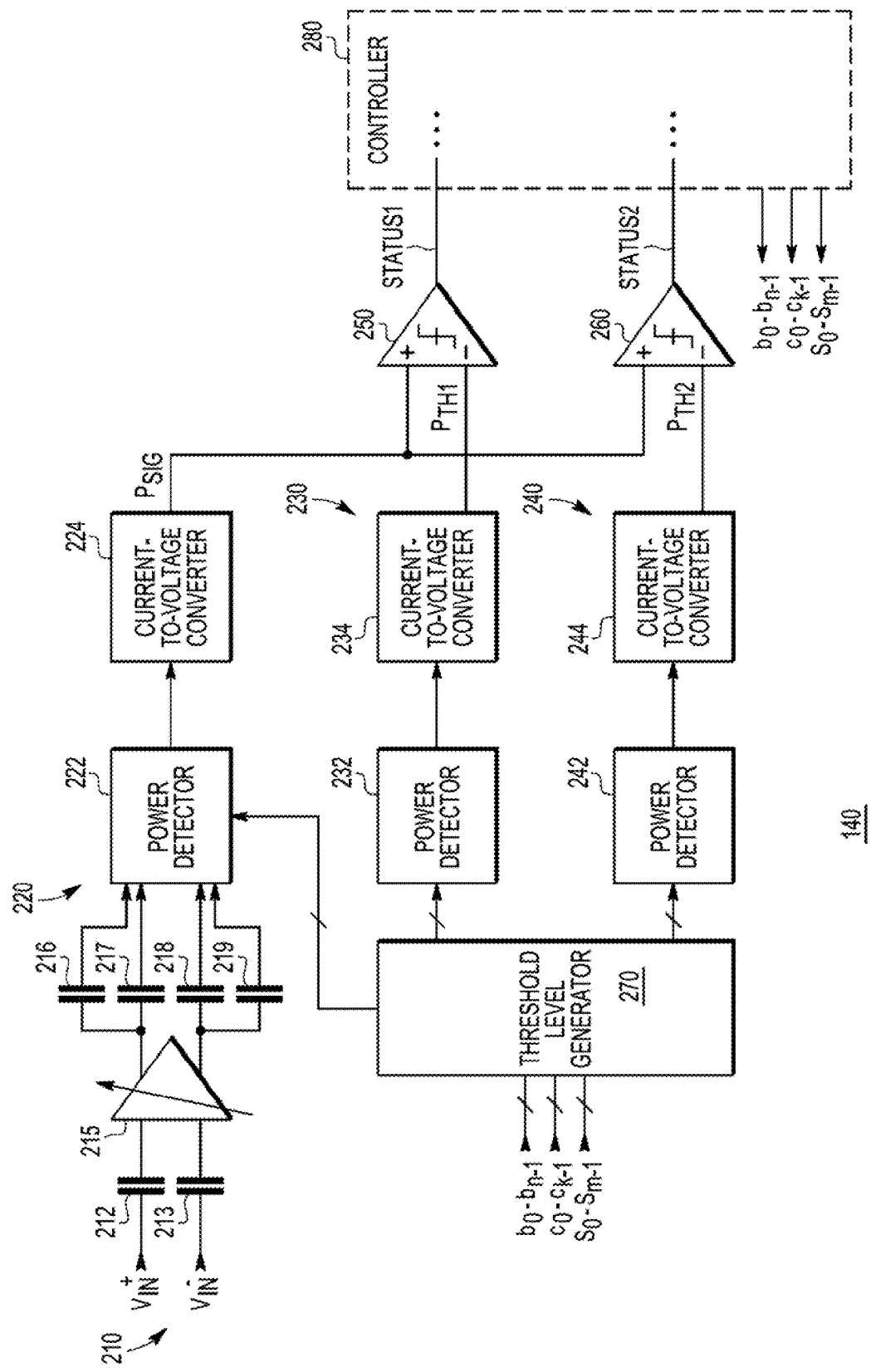
FIG. 2 illustrates in partial block diagram and partial schematic form the RF power detector of FIG. 1.

FIG. 2 illustrates in partial block diagram and partial schematic form RF power detector 140 of FIG. 1. RF power detector 140 includes generally a main path 210, a secondary path 230, a secondary path 240, comparators 250 and 260, and a threshold level generator 270. FIG. 2 also illustrates a controller 280.

Main path 210 includes capacitors 212 and 213, an amplifier 215, capacitors 216-219, a power detector 222, and a current to voltage converter 224. Capacitor 212 has a first terminal for receiving a positive component of a differential signal pair labeled "$V_{IN}^+$", and a second terminal. Capacitor 213 has a first terminal for receiving a negative component of the differential signal pair labeled "$V_{IN}^-$", and a second terminal. Amplifier 215 has a non-inverting input connected to the second terminal of capacitor 212, an inverting input connected to the second terminal of capacitor 213, a non-inverting output, an inverting output, and a control input. Capacitors 216 and 217 each have a first terminal connected to the non-inverting output of amplifier 215, and a second terminal. Capacitors 218 and 219 each have a first terminal connected to the inverting output of amplifier 215, and a second terminal. Power detector 222 has first through fourth input terminals respectively connected to the second terminals capacitors 216-219, a set of bias voltage input terminals, and an output terminal. Current-to-voltage converter 224 has an input terminal connected to the output terminal of power detector 222, and an output terminal for providing a detected power signal labeled "$P_{SIG}$".

Secondary path 230 includes a power detector 232 and a current-to-voltage converter 234. Power detector 232 has a set of bias voltage input terminals, and an output terminal. Current-to-voltage converter 234 has an input terminal connected to the output terminal of power detector 232, and an output terminal for providing a first threshold signal labeled "$P_{TH1}$".

Secondary path 240 includes a power detector 242 and a current-to-voltage converter 244. Power detector 242 has a set of bias voltage input terminals, and an output terminal. Current-to-voltage converter 244 has an input terminal connected to the output terminal of power detector 242, and an output terminal for providing a second threshold signal labeled "$P_{TH2}$".

Comparator 250 has a positive input terminal for receiving signal $P_{SIG}$, a negative input terminal for receiving signal $P_{TH1}$, and an output for providing a signal labeled "STATUS1" to controller 280. Comparator 260 has a positive input terminal for receiving signal $P_{SIG}$, a negative input terminal for receiving signal $P_{TH2}$, and an output for providing a signal labeled "STATUS2" to controller 280. Bias circuit 270 has a first input for receiving an n-bit threshold setting code labeled "$b_0$-$b_{n-1}$", a second input for receiving a k-bit offset calibration code labeled "$c_0$-$c_{k-1}$", a third input for receiving an m-bit control signal labeled "$s_0$-$s_{m-1}$" from controller 280, and three sets of outputs for providing bias voltages to the bias input terminals of power detectors 222, 232, and 242. Controller 280 also has an output, not shown in FIG. 2, connected to the control input of amplifier 215.

RF input signals $V_{IN}^+$ and $V_{IN}^-$ are components of a differential signal having useful information carried by the differential-mode signal thereof. The average value of the components is known as the common mode signal. Capacitors 212 and 213 are time-varying ("AC") coupling capacitors that remove the steady-state ("DC") components. Amplifier 215 has a bandwidth wide enough to pass signals without distortion, and an adjustable gain. For example, North American broadcast television includes desired signals in channels between 48 and 870 MHz, and thus amplifier 215 has a bandwidth larger than 870 MHz. The expected power range of the input signal determines the gain. For example in the contemplated television receiver, controller 280 switches the gain between a low gain of 0 decibels (dB) for terrestrial television systems, and a high gain of +12 dB for cable television systems. Capacitors 216-219 are DC coupling capacitors that also remove undesirable DC information in the signals at the output of amplifier 215. Since this configuration allows undesired voltage offsets produced by amplifier 215 to be substantially ignored, amplifier Power detector 222 converts the input voltage signal into an output signal that represents the power in the input signal. Power detector 222 advantageously uses CMOS transistors that obey a square-law voltage-to-current characteristic. Thus power detector 222 provides an output current that is proportional to the square of the input voltage. Note that as used herein, a "CMOS transistor" also includes an insulated gate field effect transistor that uses materials other than metal, such as polysilicon, for the gate.

Current-to-voltage converter 224 converts this current, representative of the power in the input signal, into voltage signal $P_{SIG}$. It also includes an integral lowpass filter to remove undesired high-frequency content. RF power detector 140 compares $P_{SIG}$ to multiple reference levels. In the illustrated embodiment, power detector 140 compares $P_{SIG}$ to two reference levels, $P_{TH1}$ and $P_{TH2}$, in comparators 250 and 260 to provide outputs STATUS1 and STATUS2, respectively. By detecting multiple levels, AGC controller 280 can implement sophisticated AGC algorithms to achieve better system performance. In an alternate embodiment, a power detector may include more than two comparators. In yet other possible embodiments, the output current provided by power detector 222 could be compared to one or more reference currents in one or more corresponding current-mode comparators, eliminating the need for current-to-voltage converters.

Paths 230 and 240 generate reference threshold levels $V_{TH1}$ and $V_{TH2}$. Each path includes power detectors (232 and 242) and current-to-voltage converters (234 and 244) that are constructed similarly to power detector 222 and current-to-voltage converter 224 in main path 210. In this way RF power detector 140 is able to generate STATUS1 and STATUS2 in a manner substantially independent of process, voltage, and temperature.

Threshold level generator 270 includes level converters that are digital-to-analog converters (DACs) that take the threshold setting code $b_0$-$b_{n-1}$ and convert it into corresponding sets of bias voltages. The construction and operation of bias circuit 270 will be described more fully below with reference to FIGS. 5-8.

Figure 3:
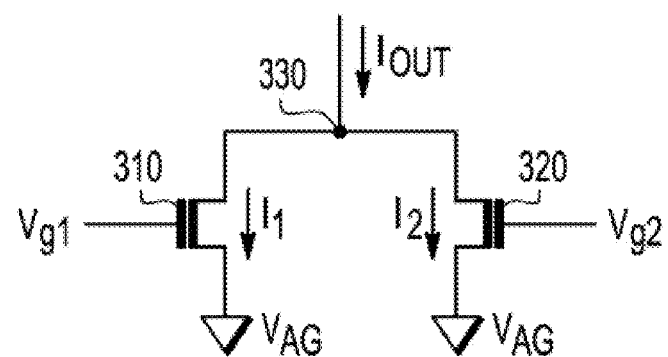
FIG. 3 illustrates in schematic form a power converter known in the prior art.

FIG. 3 illustrates in schematic form a power converter 300 known in the prior art. Power converter 300 includes N-channel MOS transistors 310 and 320. Transistor 310 has a drain connected to an output node 330, a gate for receiving a signal labeled "$V_{g1}$", and a source connected to an analog ground reference voltage terminal labeled "$V_{AG}$". Transistor 320 has a drain connected to an output node 330, a gate for receiving a signal labeled "$V_{g2}$", and a source connected to $V_{AG}$.

Generally power converter 300 uses the square-law characteristic of MOS transistors to produce a reference current labeled "$I_{OUT}$" that is proportional to a difference in voltage between $V_{g1}$ and $V_{g2}$. Assuming transistors 310 and 320 are biased correctly, then $$I_{OUT}=I_1+I_2=\alpha \cdot (V_{DC}+V_{cm})^2+\beta \cdot V_{dm}^2 \qquad [1]$$

in which $V_{DC}$ is a DC voltage, $\alpha$ and $\beta$ are constants that depend only on the transistors' device properties, $V_{cm}$ and $V_{dm}$ are the common-mode and differential-mode voltages, respectively, between $V_{g1}$ and $V_{g2}$. According to Equation [1], $I_{OUT}$ depends in part on the square of $V_{dm}$ and thus is proportional to signal power. However $I_{OUT}$ also contains a term that depends on $V_{cm}$ which is not related to signal power. Moreover $V_{cm}$ can include noise or interference components that degrade the accuracy of the power measurement. What is needed is a new power converter that removes the adverse effect of $V_{cm}$ on the measurement of differential mode power.

Figure 4:
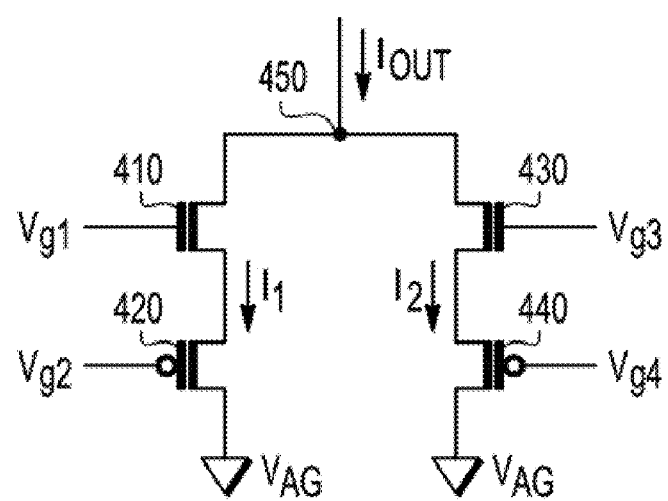
FIG. 4 illustrates in schematic form the power converter used in the power detector of FIG. 2.

Such a circuit is shown in FIG. 4, which illustrates in schematic form a power converter 400 used in power detector 222 of FIG. 2. Power converter 400 includes an N-channel MOS transistor 410, a P-channel MOS transistor 420, an N-channel MOS transistor 430, and a P-channel MOS transistor 440. Transistor 410 has a drain connected to a node 450, a gate for receiving a voltage labeled "$V_{g1}$", and a source. Transistor 420 has a source connected to the source of transistor 410, a gate for receiving a voltage labeled "$V_{g2}$", and a drain connected to $V_{AG}$. Transistor 430 has a drain connected to a node 450, a gate for receiving a voltage labeled "$V_{g3}$", and a source. Transistor 440 has a source connected to the source of transistor 420, a gate for receiving a voltage labeled "$V_{g4}$", and a drain connected to $V_{AG}$.

Transistors 410 and 420 together form a "combo" device. Similarly, transistors 430 and 440 form a combo device. The input voltages are applied as follows:

$$V_{g1} = V_{B1} + V_{in}^+ = V_{B1} + V_{cm} + \frac{V_{dm}}{2} \quad [2]$$

$$V_{g2} = V_{B2} + V_{in}^- = V_{B2} + V_{cm} - \frac{V_{dm}}{2} \quad [3]$$

$$V_{g3} = V_{B1} + V_{in}^- = V_{B1} + V_{cm} - \frac{V_{dm}}{2} \quad [4]$$

$$V_{g4} = V_{B2} + V_{in}^+ = V_{B2} + V_{cm} + \frac{V_{dm}}{2} \quad [5]$$

in which $V_{B1}$ and $V_{B2}$ are bias voltages. In this manner, current $I_{OUT}$ can be expressed as follows:

$$I_{OUT} = I_1 + I_2 = \alpha \cdot (V_{DC})^2 + \beta \cdot V_{dm}^2 \quad [6]$$

because the symmetrical structure cancels out the $V_{CM}$ term. Thus $I_{OUT}$ is proportional to signal power, but is independent of the common mode voltage $V_{cm}$. Thus the design of amplifier 215 can be relaxed and amplifier 215 can use smaller transistors than in a circuit that would be affected by offset voltage.

Power converter 400 can be used not only in power detectors like power detector 222, but also in peak detectors and envelope detectors. The actual function depends on the bandwidth of a lowpass filter following the power converter compared to the bandwidth of interest. For example, assuming there is some amplitude modulated (AM) signal content, $$V_{dm} = V_0 \cdot (1 + m \cdot \cos(\omega_m t)) \cdot \cos(\omega_c t) \quad [7]$$

Substituting this expression for $V_{dm}$ into equation [6] yields:

$$I_{OUT} \propto V_{dm} = V_0^2 (1 + m \cdot \cos(\omega_m t))^2 \cdot \cos^2(\omega_c t) \quad [8]$$
$$= V_0^2 (1 + m \cdot \cos(\omega_m t))^2 \cdot \frac{1 + \cos(2\omega_c t)}{2}$$

A lowpass filter with a bandwidth between $2\omega_m$ and $2\omega_c - 2\omega_m$ will only allow the modulating signal, i.e. $V_0^2 (1+m \cdot \cos(\omega_m t))^2$, to pass. Thus by changing the cutoff frequency of the filter, one can easily determine the peak (or the envelope) of the modulated input signal.

Figure 5:
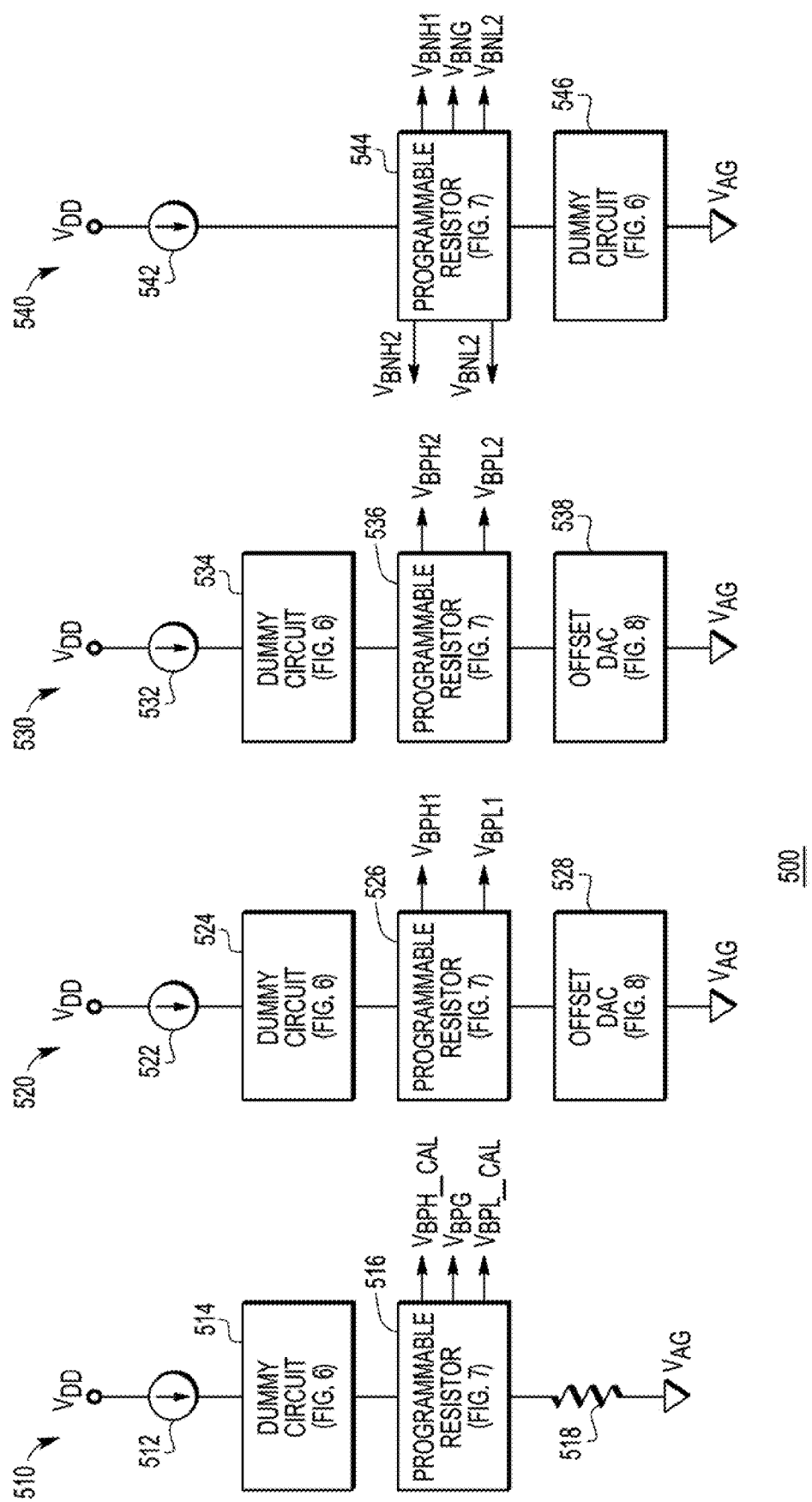
FIG. 5 illustrates in partial block diagram and partial schematic form the threshold level generator used in the power detector of FIG. 2.

FIG. 5 illustrates in partial block diagram and partial schematic form threshold level generator 270 used in RF power detector 140 of FIG. 2. Threshold level generator includes generally P-channel bias circuits 510, 520, and 530, and an N-channel bias circuit 540.

P-channel bias circuit 510 includes a current source 512, a dummy circuit 514, a programmable resistor 516, and a resistor 518. Current source 512 has a first terminal connected to a power supply voltage terminal labeled "$V_{DD}$", and a second terminal. $V_{DD}$ is a more positive power supply voltage terminal with a nominal voltage of, for example, 3.0 volts. Dummy circuit 514 has a first terminal connected to the second terminal of current source 512, and a second terminal. Programmable resistor 516 has a first terminal connected to the second terminal of dummy circuit 514, a second terminal, and output terminals for providing bias voltages labeled "$V_{BPH\_CAL}$", "$V_{BPG}$", and "$V_{BPL\_CAL}$". Resistor 518 has a first terminal connected to the second terminal of programmable resistor 516, and a second terminal connected to $V_{AG}$.

P-channel bias circuit 520 includes a current source 522, a dummy circuit 524, a programmable resistor 526, and an offset digital-to-analog converter (DAC) 528. Current source 522 has a first terminal connected to $V_{DD}$, and a second terminal. Dummy circuit 524 has a first terminal connected to the second terminal of current source 522, and a second terminal. Programmable resistor 526 has a first terminal connected to the second terminal of dummy circuit 524, a second terminal, and output terminals for providing bias voltages labeled "$V_{BPH1}$" and "$V_{BPL1}$". Offset DAC 528 has a first terminal connected to the second terminal of programmable resistor 526, and a second terminal connected to $V_{AG}$.

P-channel bias circuit 530 includes a current source 532, a dummy circuit 534, a programmable resistor 536, and an offset digital-to-analog converter (DAC) 538. Current source 532 has a first terminal connected to $V_{DD}$, and a second terminal. Dummy circuit 534 has a first terminal connected to the second terminal of current source 532, and a second terminal. Programmable resistor 536 has a first terminal connected to the second terminal of dummy circuit 534, a second terminal, and output terminals for providing bias voltages labeled "$V_{BPH2}$" and "$V_{BPL2}$". Offset DAC 538 has a first terminal connected to the second terminal of programmable resistor 536, and a second terminal connected to $V_{AG}$.

N-channel bias circuit 540 includes a current source 542, a programmable resistor 544, and a dummy circuit 546. Current source 542 has a first terminal connected to $V_{DD}$, and a second terminal. Programmable resistor 544 has a first terminal connected to the second terminal of current source 542, a second terminal, and output terminals for providing bias voltages labeled "$V_{BNH1}$", "$V_{BNL1}$", "$V_{BNH2}$", "$V_{BNL2}$", and "$V_{BNG}$". Dummy circuit 546 has a first terminal connected to the second terminal of programmable resistor 544, and a second terminal connected to $V_{AG}$.

Generally, each bias circuit provides bias voltages that reflect the appropriate nominal bias voltages of transistors in the power converter in main path power detector 222. Dummy circuits 514, 524, 534, and 546 include "combo" transistor pairs that are sized the same as the "combo" devices as described above with reference to FIG. 4 and thus mirror their characteristics. Programmable resistors 516, 526, 536, and 544 allow the bias voltages to be changed by "sliding" the values along a segmented resistor in response to threshold setting code $b_0$-$b_{n-1}$. Offset DACs 528 and 538 allow offsets to be compensated for in response to the offset setting code $c_0$-$c_{n-1}$ during a startup calibration period.

The structure and operation of the dummy circuits, programmable resistors, and offset DACs will now be described in more detail with reference to FIGS. 6-8 below. FIG. 6 illustrates in schematic form a dummy circuit 600 that can be used as any of the dummy circuits in threshold level generator 270 of FIG. 5. Dummy circuit 600 includes a single "combo" device including an N-channel MOS transistor 610 and a P-channel MOS transistor 620. Transistor 610 has a drain forming the first terminal of dummy circuit 600, a gate connected to the drain thereof, and a source. Transistor 620 has a source connected to the source of transistor 610, a gate, and a drain connected to the gate thereof and forming the second terminal of dummy circuit 600.

Ideally transistors 610 and 620 will have identical nominal characteristics to transistors 410 and 420, respectively (and transistors 430 and 440, respectively) of FIG. 4. Thus the nominal gate width, gate length, channel doping concentration, and orientation should be the same.

FIG. 7 illustrates in schematic form a programmable resistor 700 that can be used as any of the programmable resistors in threshold level generator 270 of FIG. 5. Resistor 700 includes a first resistor ladder 710, a second resistor ladder 720, a first switch network 730, and a second switch network 740. First resistor ladder 710 includes n resistors connected in series between the first terminal of variable resistor 700 and an intermediate terminal. The intermediate terminal provides bias voltages $V_{BPG}$ or $V_{BNG}$, as the case may be, that represent the average between the voltages on the first and second terminals, and thus the intermediate terminal can be used to generate a desired common mode voltage. Second resistor ladder 720 includes n resistors connected in series between the intermediate and second terminals of variable resistor 700. First switch network 730 includes n switches each having a first terminal connected to a corresponding terminal of resistor ladder 710, a second terminal connected to a first output terminal of programmable resistor 700, and a control terminal connected to a respective one of threshold setting code signals $b_{0,1}$-$b_0$. The first output terminal provides bias voltages $V_{BPH\_CAL}$, $V_{BPD1}$, $V_{BPH2}$, $V_{BNH1}$, or $V_{BNH2}$, as the case may be. Second switch network 740 also includes n switches each having a first terminal connected to a corresponding terminal of resistor ladder 720, a second terminal connected to a second output terminal of programmable resistor 700, and a control terminal connected to a respective one of threshold setting code signals $b_o$-$b_{n-1}$. The second output terminal provides bias voltages $V_{BPL\_CAL}$, $V_{BPL1}$, $V_{BNL1}$, or $V_{BNL2}$, as the case may be. Each of switch networks 730 and 740 effectively multiplex multiple bias points to the corresponding output terminal of variable resistor 700. In the contemplated embodiment, resistors in resistor ladders 710 and 720 are logarithmically weighted and control signals $b_0$-$b_{n-1}$ are thermometer coded.

FIG. 8 illustrates in schematic form an offset DAC 800 that can be used as either of offset DACs in threshold level generator 270 of FIG. 5. Offset DAC 800 includes a resistor ladder 810 and a switch network 820. Resistor ladder 810 includes k resistors connected in series between the first and second terminals of offset DAC 800. Switch network 820 includes k switches each having a first terminal connected to a corresponding terminal of resistor ladder 810, a second terminal connected to the second terminal of offset DAC 800, and a control terminal connected to a respective one of offset calibration code signals $c_0$-$c_{k-1}$. Each switch is set so as to short the second terminal of offset DAC 800 to an intermediate point along resistor ladder 810 thereby decreasing its resistance. In the contemplated embodiment, resistors in resistor ladder 810 are equally weighted and control signals $c_0$-$c_{k-1}$ are thermometer coded FIG. 9 illustrates in partial block diagram and partial schematic form a particular embodiment of a portion 900 of power detector 140 of FIG. 2. In general, portion 900 includes power detectors 222, 232, and 242, current-to-voltage converters 224, 234, and 244, comparators 250 and 260, and a mixing block 920. As more particularly shown in FIG. 9, power detector 222 includes a current source 912 and transistors 410-440 as previously described in FIG. 4. Current source 912 has a first terminal connected to $V_{DD}$, and a second terminal connected to node 450. Power detector 222 uses current source 912 to establish a quiescent current into node 450, allowing the output current to vary in response to smaller variations in $V_{dm}$.

Likewise power converters 232 and 242 include similar current sources. Power detector 232 includes a current source 940, an N-channel transistor 941, a P-channel transistor 942, an N-channel transistor 943, and a P-channel transistor 944. Current source 940 has a first terminal connected to $V_{DD}$, and a second terminal. Transistor 941 has a drain connected to the second terminal of current source 940, a gate for receiving bias voltage $V_{BNH1}$, and a source. Transistor 942 has a source connected to the source of transistor 941, a gate for receiving bias voltage $V_{BPL1}$, and a drain connected to $V_{AG}$. Transistor 943 has a drain connected to the second terminal of current source 940, a gate for receiving bias voltage $V_{BNL1}$, and a source. Transistor 944 has a source connected to the source of transistor 943, a gate for receiving bias voltage $V_{BPH1}$, and a drain connected to $V_{AG}$.

Power detector 242 includes a current source 950, an N-channel transistor 951, a P-channel transistor 952, an N-channel transistor 953, and a P-channel transistor 954. Current source 950 has a first terminal connected to $V_{DD}$, and a second terminal. Transistor 951 has a drain connected to the second terminal of current source 950, a gate for receiving bias voltage $V_{BNH2}$, and a source. Transistor 952 has a source connected to the source of transistor 951, a gate for receiving bias voltage $V_{BPL2}$, and a drain connected to $V_{AG}$. Transistor 953 has a drain connected to the second terminal of current source 950, a gate for receiving bias voltage $V_{BNL2}$, and a source. Transistor 954 has a source connected to the source of transistor 953, a gate for receiving bias voltage $V_{BPH2}$, and a drain connected to $V_{AG}$.

Current-to-voltage converter 224 includes an amplifier 960, a resistor 962, and a capacitor 964. Amplifier 960 has an inverting input connected to node 450, a noninverting input connected to $V_{AG}$, and an output for providing signal $P_{SIG}$. Resistor 962 has a first terminal connected to the inverting input of amplifier 960, and a second terminal connected to the output of amplifier 960. Capacitor 964 has a first terminal connected to the inverting input of amplifier 960, and a second terminal connected to the output of amplifier 960.

Current-to-voltage converter 234 includes an amplifier 970, a resistor 972, and a capacitor 974. Amplifier 970 has an inverting input connected to the second terminal of current source 940, a noninverting input connected to $V_{AG}$, and an output for providing signal Resistor 972 has a first terminal connected to the inverting input of amplifier 970, and a second terminal connected to the output of amplifier 970. Capacitor 974 has a first terminal connected to the inverting input of amplifier 970, and a second terminal connected to the output of amplifier 970.

Current-to-voltage converter 244 includes an amplifier 980, a resistor 982, and a capacitor 984. Amplifier 980 has an inverting input connected to the second terminal of current source 950, a noninverting input connected to $V_{AG}$, and an output for providing signal $P_{TH2}$. Resistor 982 has a first terminal connected to the inverting input of amplifier 980, and a second terminal connected to the output of amplifier 980. Capacitor 984 has a first terminal connected to the inverting input of amplifier 980, and a second terminal connected to the output of amplifier 980.

In a normal operation mode, signals S1, S2, S7, and S8 are all active and close their corresponding switches, providing signals $V_{BNG}$ or $V_{BPG}$, as the case may be, to the gates of their respective transistors. All other control signals are inactive leaving their respective switches open. Capacitors 216-219 serve to mix the AC components of the input signal with the DC bias voltages onto the gates of their respective transistors. Thus the voltage at the gate of transistor 410 is equal to bias voltage $V_{BNG}$ plus a positive component of the differential input signal, i.e. $V_{IN}^+$. The voltage at the gate of transistor 420 is equal to bias voltage $V_{BPG}$ plus a negative component of the differential input signal, i.e. $V_{IN}^-$. The voltage at the gate of transistor 430 is equal to bias voltage $V_{BNG}$ plus $V_{IN}^-$. The voltage at the gate of transistor 440 is equal to bias voltage $V_{BPG}$ plus $V_{IN}^+$. These bias voltages allow the output current to be independent of the common mode voltage $V_{cm}$ as described above.

In an offset calibration mode, signals S1, S2, S7, and S8 are all inactive and open their corresponding switches. Signals $V_{IN}^+$ and $V_{IN}^-$ are forced to zero levels. When calibrating path 230, controller 280 activates signals S3, S4, S9, and S10, closing their corresponding switches, while keeping all other control signals inactive. For each possible value of threshold setting code $b_0$-$b_{n-1}$, controller 280 determines a value for the offset calibration code $b_0$-$b_{k-1}$ such that the value of $P_{TH1}$ is close enough to the value of $P_{SIG}$ to cause the output of comparator 250, i.e. STATUS1, to change state. Controller 280 stores the corresponding offset calibration codes in a memory (not shown in FIG. 2), and repeats this operation for every possible value of the threshold setting code. Thus as a result of the calibration operation, controller 280 constructs a table containing pairs of specific threshold setting codes and their corresponding offset correction codes. Subsequently during normal operation mode, controller 280 selects a threshold setting code according to its AGC algorithm, reads the corresponding calibration code from memory, and outputs the values of the threshold setting code and offset calibration code to threshold level generator 270. At this point the offset in the system is substantially lowered such that the signal power can be detected accurately.

When calibrating path 240, controller 280 activates signals S5, S6, S9, and S10, closing their corresponding switches, while keeping all other control signals inactive. Controller 280 repeats the procedure outlined above, but monitors when STATUS2 changes state instead.

If the power detector were to use additional threshold levels, then controller 280 would repeat this procedure for as many additional threshold generating paths as may be present. Note that controller 280 can use a variety of known techniques to quickly determine the correct value of $c_0$-$c_{k-1}$, including linear and binary searching.

The above-disclosed subject matter is to be considered illustrative, and not restrictive, and the appended claims are intended to cover all such modifications, enhancements, and other embodiments that fall within the true scope of the claims. Thus, to the maximum extent allowed by law, the scope of the present invention is to be determined by the broadest permissible interpretation of the following claims and their equivalents, and shall not be restricted or limited by the foregoing detailed description.

What is claimed is:

1. A power detector comprising:
    a power detector core having positive and negative inputs for respectively receiving positive and negative components of a differential input signal, and an output providing a power signal proportional to a power in said differential input signal, wherein said power detector core comprises:
        a power converter having positive and negative inputs respectively receiving positive and negative components of said differential input signal, and an output for providing a current signal proportional to a power in said differential input signal; and
        a transimpedance amplifier having an input coupled to said output of said power converter, and an output for providing said power signal;
    a first comparator having a first input coupled to said output of said power detector core, a second terminal for receiving a first power threshold signal, and an output for providing a first status signal; and
    a second comparator having a first input coupled to said output of said power detector core, a second terminal for receiving a second power threshold signal different from said first power threshold signal, and an output for providing a second status signal.

2. The power detector of claim 1 wherein said transimpedance amplifier has a lowpass filter response.

3. The power detector of claim 1, wherein the power converter comprises:
    a first transistor of a first conductivity type having a first current electrode coupled to an output node, a control electrode for receiving a first voltage substantially equal to a first bias voltage plus a positive component of said differential input signal, and a second current electrode;
    a second transistor of a second conductivity type opposite said first conductivity type having a first current electrode coupled to said second current electrode of said first transistor, a control electrode for receiving a second voltage substantially equal to a second bias voltage plus a negative component of said differential input signal, and a second current electrode coupled to a reference voltage terminal;
    a third transistor of said first conductivity type having a first current electrode coupled to said output node, a control electrode for receiving a third voltage substantially equal to said first bias voltage plus said negative component of said differential input signal, and a second current electrode; and
    a fourth transistor of said second conductivity type having a first current electrode coupled to said second current electrode of said third transistor, a control electrode for receiving a fourth voltage substantially equal to said second bias voltage plus said positive component of said differential input signal, and a second current electrode coupled to said reference voltage terminal.

4. The power detector of claim 3, further comprising bias circuitry for generating said first and second bias voltages and having outputs for providing said first, second, third, and fourth voltages.

5. The power detector of claim 4, wherein said bias circuitry further has inputs for receiving a threshold setting code, an offset calibration code provides said first and second bias voltages and said differential input signal, and outputs for providing said first, second, third, and fourth voltages.

6. The power detector of claim 3, wherein said first conductivity type is N-type, and said second conductivity type is P-type, and said first, second, third, and fourth transistors are metal-oxide-semiconductor field effect transistors (MOSFETs), 7. A power detector comprising:
    a power detector core having positive and negative inputs tor respectively receiving positive and negative components of a differential input signal, and an output providing a power signal proportional to a power in said differential input signal;
    a first comparator having a first input coupled to said output of said power detector core, a second terminal for receiving a first power threshold signal, and an output for providing a first status signal;
    a second comparator having a first input coupled to said output of said power detector core, a second terminal for receiving a second power threshold signal different from said first power threshold signal, and an output for providing a second status signal;

a first capacitor having a first terminal for receiving a positive component of a differential radio frequency (RF) input signal, and a second terminal;

a second capacitor having a first terminal for receiving a negative component of said differential RF input signal, and a second terminal;

an amplifier having a positive input coupled to said second terminal of said first capacitor, a negative input coupled to said second terminal of said second capacitor, and positive and negative outputs;

a third capacitor having a first terminal coupled to said positive output of said amplifier, and a second terminal for providing said positive component of said differential input signal; and a fourth capacitor having a first terminal coupled to said positive output of said amplifier, and a second terminal for providing said negative component of said differential input signal.

8. A power detector comprising:

a power detector core having positive and negative inputs for respectively receiving positive and negative components of a differential input signal. and an output providing a power signal proportional to a power in said differential input signal;

a first comparator having a first input coupled to said output of said power detector core, a second terminal for receiving a first power threshold signal, and an output for providing a first status signal;

a second comparator having a first input coupled to said output of said power detector core, a second terminal for receiving a second power threshold signal different from said first power threshold signal, and an output for providing a second status signal; and a threshold circuit having an input for receiving a threshold setting code, a first output for providing said first power threshold signal, and a second output for providing said second power threshold signal, wherein said threshold circuit changes said first and second power threshold signals based on said threshold setting code, wherein said threshold circuit comprises:

a first path having an output for providing said first power threshold, wherein said first path includes a first circuit substantially similar to said power detector core; and a second path having an output for providing said second power threshold, wherein said second path includes a second circuit substantially similar to said power detector core.

9. The power detector of claim 8 further wherein:

said threshold circuit further receives a calibration code and changes said first and second power thresholds in response thereto; and the power detector further comprises a controller that calibrates the power detector by associating a calibration code, which substantially removes offsets in said power converter core, with each threshold setting code.

* * * * *

UNITED STATES PATENT AND TRADEMARK OFFICE
CERTIFICATE OF CORRECTION

| | |
|---|---|
| PATENT NO. | : 8,264,255 B2 |
| APPLICATION NO. | : 12/611151 |
| DATED | : September 11, 2012 |
| INVENTOR(S) | : Ruifeng Sun et al. |

It is certified that error appears in the above-identified patent and that said Letters Patent is hereby corrected as shown below:

In column 3, line 61, add "215 can be made small in area and fast in speed." after "amplifier".

In column 10, line 51, replace "," with ".".

In column 10, line 54, replace "tor" with "for".

In column 11, line 22, replace "." with ",".

Signed and Sealed this
Eleventh Day of December, 2012

David J. Kappos
*Director of the United States Patent and Trademark Office*